United States Patent [19]

Yamamura et al.

[11] Patent Number: 5,153,451
[45] Date of Patent: Oct. 6, 1992

[54] FAIL SAFE LEVEL SHIFTER

[75] Inventors: Norihisa Yamamura, Tokyo; Kazunori Hibino, Toshima; Tatsuo Hayakawa, Asao, all of Japan

[73] Assignee: Motorola, Inc., Schaumburg, Ill.

[21] Appl. No.: 746,549

[22] Filed: Aug. 19, 1991

[51] Int. Cl.⁵ ................... H03K 17/10; H03K 17/687
[52] U.S. Cl. .................................. 307/279; 307/264; 307/268
[58] Field of Search .................. 307/264, 279, 268

[56] References Cited

U.S. PATENT DOCUMENTS 4,695,744  9/1987  Giordano .................. 307/264 X
4,996,443  2/1991  Tateno ...................... 307/279 X Primary Examiner—Eugene R. LaRoche
Assistant Examiner—Do Hyun Yoo
Attorney, Agent, or Firm—Bradley J. Botsch

[57] ABSTRACT

A fail safe level shifter assures that, when an input signal voltage level falls below a given threshold voltage, the output is either a constant high or no signal at all. Additionally, a range of digital high signals having a voltage less than the given threshold voltage may be shifted by the fail safe level shifter. The fail safe level shifter expands the width of an N-MOS channel of conventional level shifters by placing two MOS switches in parallel. The resultant resistance allows the fail safe level shifter to register those high signals which are below the given threshold voltage. One-half of the level shifter has a N-MOS channel about one-half the width of a N-MOS channel in the other half of the level shifter. Therefore, the narrower half is unable to fully activate given the low input signals received. The fail safe level shifter thus assures that the output will be a constant high.

3 Claims, 2 Drawing Sheets

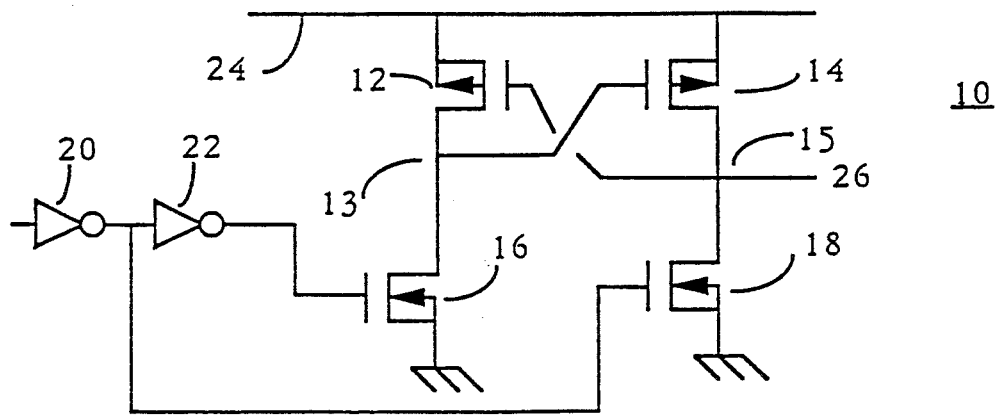
PRIOR ART                Fig. 1
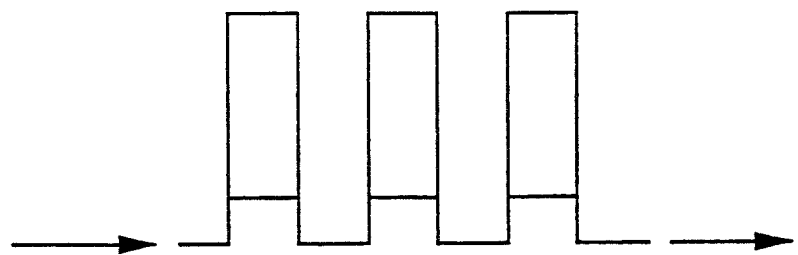
Fig. 2

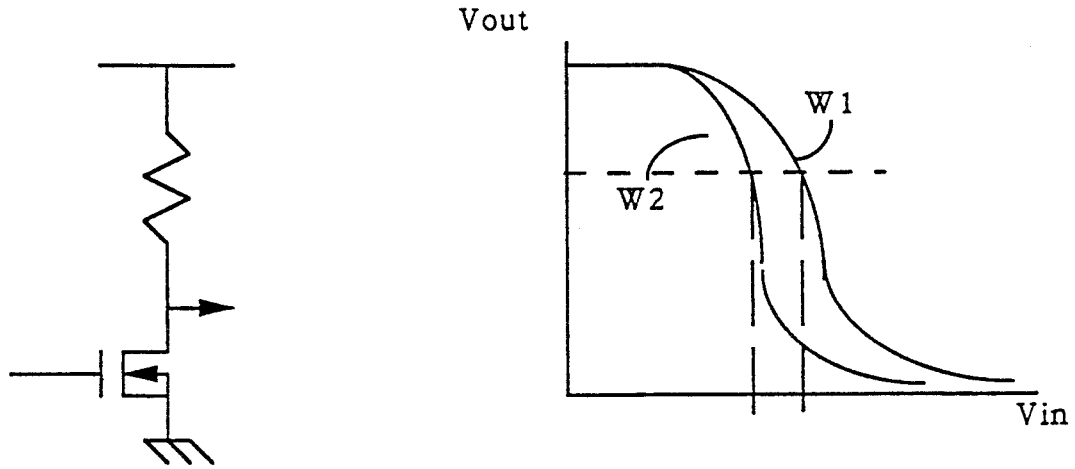
FIG. 3
Fig. 4
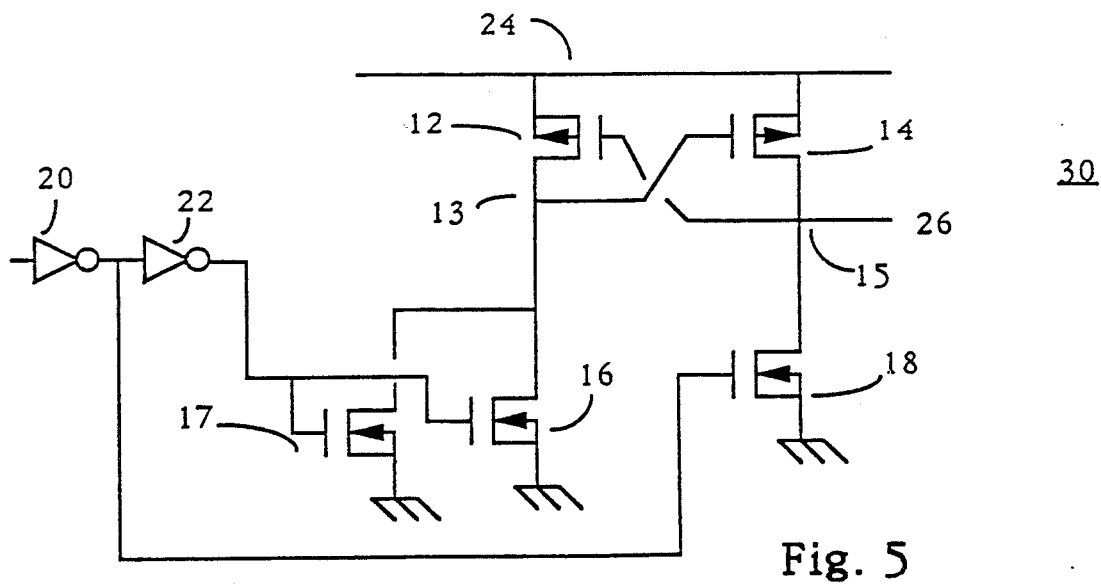
Fig. 5

FAIL SAFE LEVEL SHIFTER

BACKGROUND OF THE INVENTION

This invention relates to digital signal level shifters.

The purpose of a level shifter is to receive an input digital signal having a given voltage level, and output a second signal at a voltage greater than the input value.

Frequently, the power of the input signal will begin to decrease in value causing a drop in the input lows and highs. Eventually, such input signals lack sufficient power to turn the various switches of the level shifter on or off. As the signal weakens to a given threshold voltage (the voltage required to activate the switches of the level shifter), subsequent high signals which are slightly less than the threshold voltage will not be registered. Additionally, the output of the level shifter will be in one of two different states: constant high, or constant low. The chance of being constant high versus constant low is 50—50.

SUMMARY OF THE INVENTION

According to the present invention, a fail safe level shifter assures that, when an input signal voltage level falls below a given threshold voltage, the output is either a constant high or no signal at all. Additionally, a range of digital high signals having a voltage less than the given threshold voltage may be shifted by the fail safe level shifter. The fail safe level shifter expands the width of an N-MOS channel of conventional level shifters by placing two MOS switches in parallel. The resultant resistance allows the fail safe level shifter to register those high signals which are below the given threshold voltage. One-half of the level shifter has a N-MOS channel about one-half the width of a N-MOS channel in the other half of the level shifter. Therefore, the narrower half is unable to fully activate given the low input signals received. The fail safe level shifter thus assures that the output will be a constant high.

The above and other objects, features, and advantages of the present invention will be better understood from the following detailed description taken in conjunction with the accompanying drawings.

BRIEF DESCRIPTION OF THE DRAWING

FIG. 1 is a schematic diagram of a prior art level shifter.

FIG. 2 is a diagram of a digital signal passing through the shifter of FIG. 1.

FIG. 3 shows a simplified diagram of one side of a level shifter.

FIG. 4 shows a plot of Vout versus Vin.

FIG. 5 shows a diagram of a fail-safe level shifter according to the present invention.

DETAILED DESCRIPTION OF THE INVENTION

FIG. 1 shows a conventional digital level shifter 10 according to the prior art. The prior art shifter 10 comprises MOS switches 12, 14, 16, and 18, and inverters 20 and 22. MOS switches 12 and 16 are coupled in series between Vdd 24 and ground. Similarly, MOS 14 and 18 are coupled in series between Vdd 24 and ground. The gate of MOS 12 is coupled between MOS 14 and 18, while the gate of MOS 14 is coupled between MOS 12 and 16. An output 26 is coupled between MOS 14 and 18. The gate of MOS 16 is coupled to the output of inverter 22, and the gate of MOS 18 is coupled to the output of inverter 20. Inverter 22 is coupled in series to inverter 20.

As shown in this embodiment of the prior art, MOS 16 and 18 are activated with a high signal at their respective gates. MOS 12 and 14 are activated with a low signal at their respective gates.

The purpose of shifter 10 is to receive an input signal having a given voltage level and output a second signal having a voltage substantially greater than the initial value. For instance, referring to FIG. 2, an input signal having a value of 1.5 v is received by shifter 10. The output signal (transposed on the input signal to represent the wave form) is 5 volts.

Referring again to FIG. 1, the input signal of FIG. 2, assuming an input high signal of 1.5 v, is received by inverter 20 and inverted to a low. This registers a low at MOS 18 and MOS 18 is not activated. The low signal is also received by inverter 22 and inverted to a high (1.5v). The high signal activates MOS 16. Since the drain of MOS 16 is coupled to ground, MOS 16 operates as a resistor drawing the output of MOS 16 and MOS 12 down towards ground. As the voltage at node 13 drops near ground, the voltage at the gate of MOS 14 is near ground and MOS 14 is activated. The source of MOS 14 is coupled to Vdd 24 which is set at the preferred shifted voltage. With MOS 14 on, and MOS 18 off showing an infinite impedance, the high signal generated by MOS 14, showing a high at node 15, turns MOS 12 off. A high, in this case 5 v, is output at output 26.

When a low signal is received by inverter 20, MOS 18 receives a high and is fully activated. MOS 16 receives a low and turns off. Since MOS 18 is on and coupled to ground, MOS 18 operates as a resistor drawing the voltage at node 15 down towards ground. The low voltage at 15 causes MOS 12 to turn on. MOS 16, in its off state, appears to be a resistor having infinite impedance. With MOS 12 on and drawing a high voltage from Vdd, and MOS 16 showing infinite impedance, the voltage at node 13 will be high and turns MOS 14 off. With MOS 14 off, MOS 18 draws the voltage at node 15 towards ground and a low is output at 26. The resultant wave form is shown in FIG. 2.

Each pair of serial MOS has an associated logical threshold voltage, under which the input voltage Vin will not turn the MOS on. Referring briefly to FIG. 4, the curve of the MOS switches is plotted according to Vin and Vout. The logical threshold voltage is found by subtracting from the maximum Vout the threshold voltage of the P-MOS channels being used (Vthp). The value of Vin is determined by projecting a line down to Vin where the Vout max−Vthp intersects the curve. This value is termed the logical threshold voltage and is the voltage needed to fully activate the MOS.

Frequently, the input wave form will decrease in power, and the voltage level of the signal will fall. The falling signal will eventually fall below the logical threshold voltage. At such a time, depending on which MOS turns on last, the level shifter will output in one of two conditions: output a continuous high signal; or output a continuously low signal. When an output occurs, the chance of having a high signal rather than a low signal is about 50—50. It is therefore highly difficult to predict the output and failure can occur. Therefore, one of the probabilities must be eliminated.

The solution to this problem is found by first analyzing one-half of the level shifter. FIG. 3 shows a simplified model of one-half of level shifter 10 (for example, MOS 12 and 16). MOS 12 is replaced by a resultant resistor. It should be recognized that MOS 16 also operates as a resistor both in an on and off state. In the on state, the resistance brings the voltage at node 13 closer to ground. In the off state, the resistance looks infinite. The resistance of MOS 12 in FIG. 3 is found by:

$$R_{onmos} = V_{out}/I_d = \frac{1}{[(kW/L)(V_{in} - V_{thn})]} \quad (1)$$

where Vout is the output at 26, Id is the current, k is a constant, W is the width of the MOS channel, L is the length of the MOS channel, Vin is the input voltage, and Vthn is the N-channel threshold voltage. Vout is defined as:

$$V_{out} = V_{dd}\left[\frac{R_{onmos}}{(R_L) + (R_{onmos})}\right] \quad (2)$$

where $R_L$ is the resistance of MOS 12 and RonMOS is the resistance of MOS 16 in its on state. Equation (2) becomes $$= \frac{V_{dd}}{(R_L)(kW/L)(V_{in} - V_{thn}) + 1} \quad (3)$$

Reviewing Equation (3) we note that Vout is inversely proportional to the width of the MOS channel W. Plotting equation (3) using more than one W (FIG. 4) shows that as the width of W increases, substantially less Vin is required to produce a desired Vout. Further, less Vin is required to reach Vout−Vthp for wider MOS channel widths. Similarly, Equation 3 shows that if the length of the resistor MOS (12 and 14) increases, less Vin will be required.

FIG. 5 shows a fail safe level shifter 30 which comprises the MOS 12, 14, 16, and 18 switches, but also comprises MOS 17. With the addition of MOS 17, the width of the MOS channel on the left side of shifter 30 (MOS 16 and MOS 17) is much greater than the width of MOS 18. As explained above, the greater the width of the N-MOS channel (MOS 16 and 17), the less voltage is required to turn the P-MOS (MOS 14) on. In other words, a weak signal will be able to generate sufficient voltage in MOS 16 and 17 to draw the voltage at node 13 towards ground. With the voltage at node 13 drawn down, MOS 14 is turned on and a high voltage is present at node 15. Since MOS 18 is off and showing an infinite impedance, MOS 12 sees the high at node 15 and shuts off, while the high signal of Vdd is output at 26.

When a low is input, MOS 16 and 17 turn off showing an infinite impedance. However, the high impedance of MOS 18 does not change since the signal is too weak for the width of the channel. Therefore, MOS 18 is unable to draw node 15 down towards ground. With node 15 still at a high, MOS 12 remains off showing an infinite impedance. Therefore, a low signal is seen at the gate of MOS 14 and MOS 14 remains on. A continuous high (Vdd) is output at 26 and the probability of a continuous low is removed. Only when the input signal is strengthened to the logical threshold voltage of MOS 18 will a low be output at 26.

As explained above, modifications to MOS 12 can produce the same effect as modifications of MOS 16. In other words, lengthening the channel of MOS 12 can reduce the Vin required to fully activate the series MOS (MOS 12 and 16).

Thus there has been provided, in accordance with the present invention, a fail safe level shifter that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A fail safe level shifter, comprising:
  a first PMOS transistor having first and second current carrying electrodes and a control electrode, said second current carrying electrode of said first PMOS transistor being coupled to a first supply voltage terminal, said control electrode of said first transistor being coupled to provide an output of the fail safe level shifter;
  a second transistor having first and second current carrying electrodes and a control electrode, said first current carrying electrode being coupled to the output of the fail safe level shifter, said second current carrying electrode of said second transistor being coupled to said first supply voltage terminal, said control electrode of said second transistor being coupled to said first current carrying electrode of said first transistor;
  a third transistor having first and second current carrying electrodes and a control electrode, said first current carrying electrode of said third transistor being coupled to said first current carrying electrode of said second transistor, said second current carrying electrode of said third transistor being coupled to a second supply voltage terminal, and said control electrode of said third transistor being coupled to receive an input signal;
  a fourth transistor having first and second current carrying electrodes and a control electrode, said first current carrying electrode of said fourth transistor being coupled to said first current carrying electrode of said first transistor, said second current carrying electrode of said fourth transistor being coupled to said second supply voltage terminal, said control electrode of said fourth transistor being coupled to receive the inversion of said input signal; and
  a fifth transistor having first and second current carrying electrodes and a control electrode, said first and second current carrying electrodes and said control electrode of said fifth transistor being respectively coupled to said first and second current carrying electrodes and said control electrode of said fourth transistor such that said fifth transistor is coupled in parallel with said fourth transistor to increase the width of said fourth transistor thereby decreasing the logical threshold of said second transistor.

2. The fail safe level shifter according to claim 1, wherein said first and second transistors are PMOS channel transistors.

3. The fail safe level shifter according to claim 1 wherein said third, fourth and fifth transistors are NMOS channel transistors.

* * * * *

UNITED STATES PATENT AND TRADEMARK OFFICE
CERTIFICATE OF CORRECTION

PATENT NO. : 5,153,451

DATED : October 6, 1992

INVENTOR(S) : YAMAMURA, Norihisa et al.

It is certified that error appears in the above-identified patent and that said Letters Patent is hereby corrected as shown below:

Column 4, line 62, claim 2, please delete the word "fall" and insert therefor the word --fail--.

Signed and Sealed this

Fourth Day of January, 1994

*Attest:*

BRUCE LEHMAN

*Attesting Officer*     Commissioner of Patents and Trademarks